(12) United States Patent
Kitagawa et al.

(10) Patent No.: US 8,089,081 B2
(45) Date of Patent: Jan. 3, 2012

(54) SEMICONDUCTOR LIGHT EMITTING DEVICE

(75) Inventors: Ryota Kitagawa, Fuchu (JP); Akira Fujimoto, Kawasaki (JP); Koji Asakawa, Kawasaki (JP); Takeyuki Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 261 days.

(21) Appl. No.: 12/404,807

(22) Filed: Mar. 16, 2009

(65) Prior Publication Data
US 2010/0065868 A1 Mar. 18, 2010

(30) Foreign Application Priority Data
Sep. 12, 2008 (JP) .................. 2008-235513

(51) Int. Cl.
*H01L 33/00* (2010.01)
(52) U.S. Cl. ................... 257/95; 257/E33.068
(58) Field of Classification Search .................... 257/95, 257/E33.068, E33.074
See application file for complete search history.

(56) References Cited

U.S. PATENT DOCUMENTS

| | | | |
|---|---|---|---|
| 6,107,644 A * | 8/2000 | Shakuda et al. | 257/79 |
| 6,825,056 B2 * | 11/2004 | Asakawa et al. | 438/47 |
| 7,037,738 B2 | 5/2006 | Sugiyama et al. | |
| 7,179,672 B2 | 2/2007 | Asakawa et al. | |
| 7,476,910 B2 | 1/2009 | Fujimoto et al. | |
| 7,645,625 B2 * | 1/2010 | Ono et al. | 438/38 |

FOREIGN PATENT DOCUMENTS

| | | |
|---|---|---|
| JP | 2001-151834 | 6/2001 |
| JP | 2006-108635 | 4/2006 |
| JP | 2006-261659 | 9/2006 |
| JP | 4077312 | 2/2008 |
| WO | WO 2007/114503 | * 10/2007 |

* cited by examiner

*Primary Examiner* — Mark Prenty
(74) *Attorney, Agent, or Firm* — Oblon, Spivak, McClelland, Maier & Neustadt, L.L.P.

(57) ABSTRACT

A semiconductor light emitting device including: a substrate; an electrode layer; and a semiconductor multilayer film disposed between the substrate and the electrode layer, the semiconductor multilayer film including: an n-type semiconductor layer; a p-type semiconductor layer; and an active layer disposed between the n-type semiconductor layer and the p-type semiconductor layer, wherein the semiconductor multilayer film has a light extraction surface from which a light emitted in the semiconductor multilayer film is extracted, the light extraction surface being formed with a relief structure having nano-scaled convex portions, wherein the relief structure is formed to have variation in equivalent circular diameters of the convex portions, and wherein 90% or more of the convex portions in the relief structure are configured to have circularity coefficient of (4π×(area)/(circumferential length)$^2$) being equal to or larger than 0.7.

7 Claims, 5 Drawing Sheets

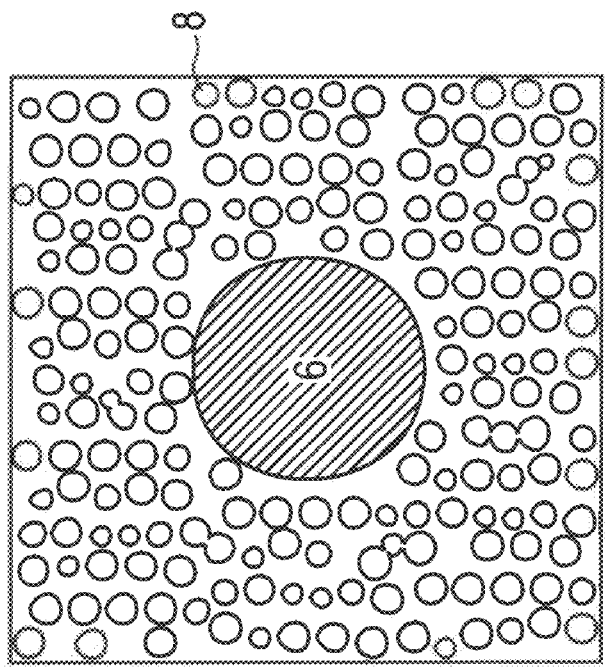
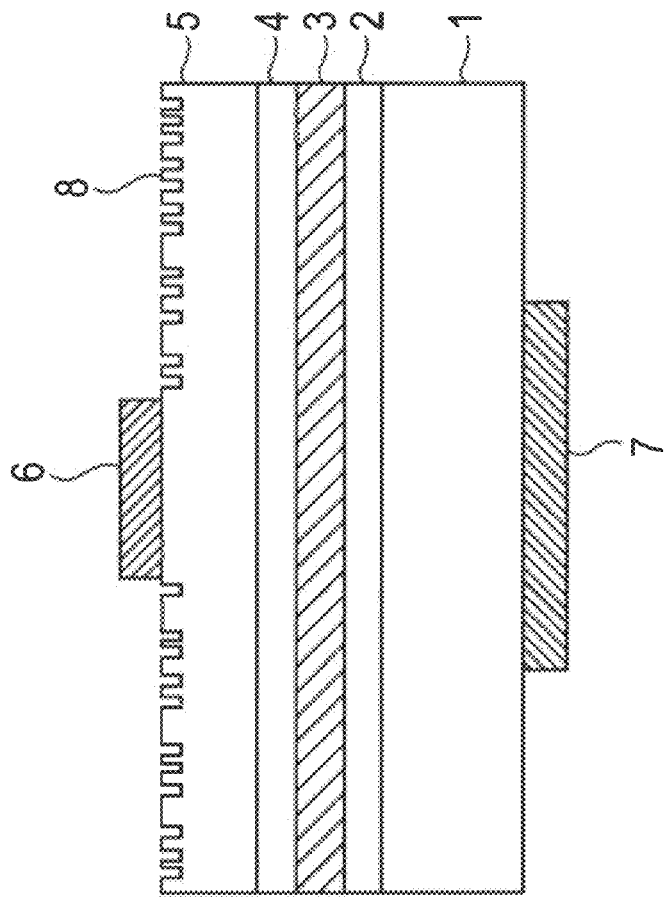
FIG. 2A
FIG. 2B

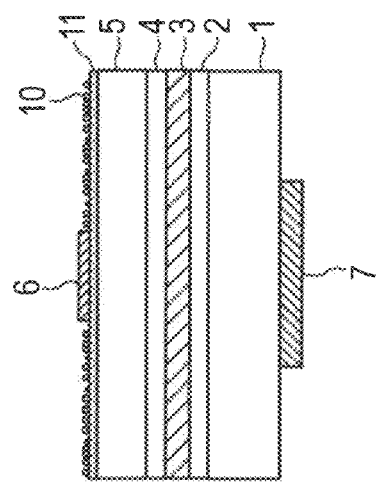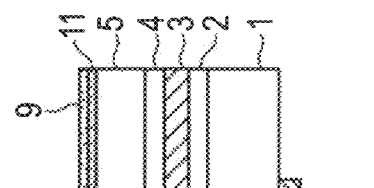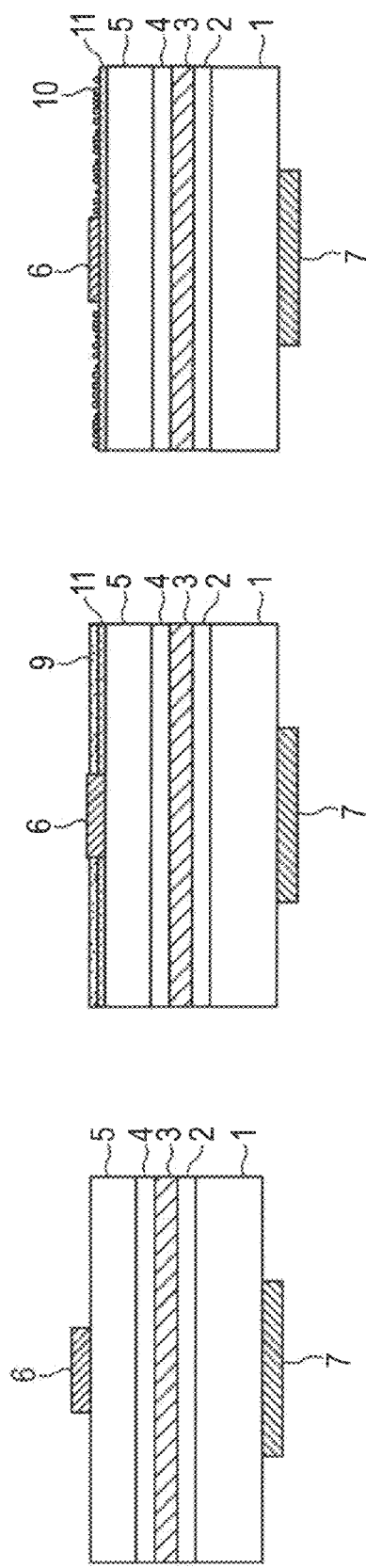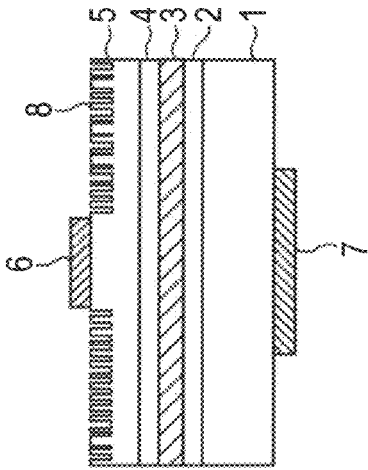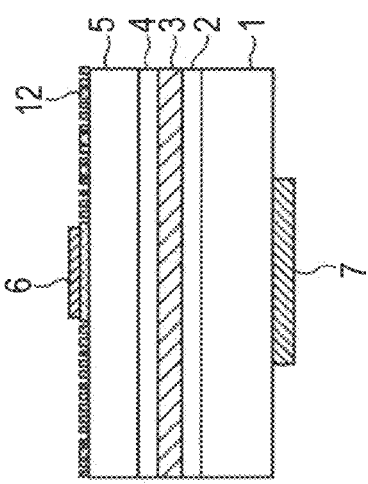

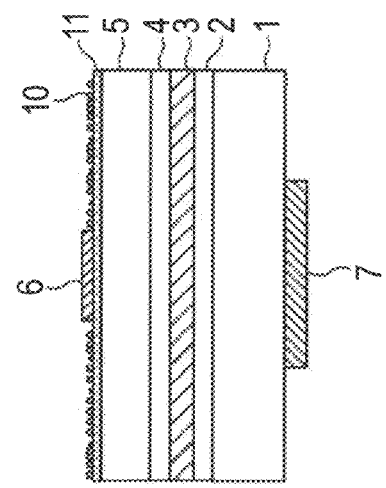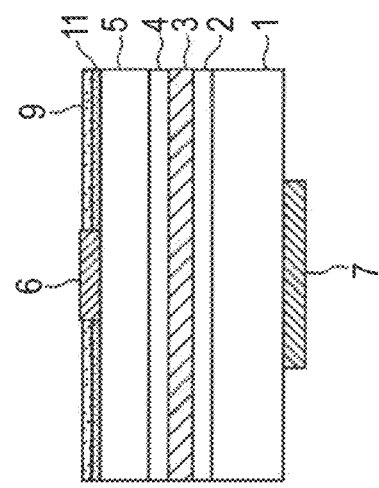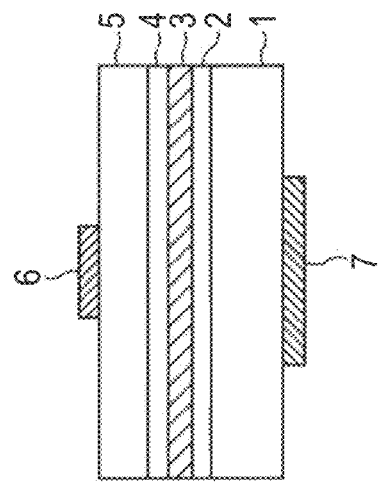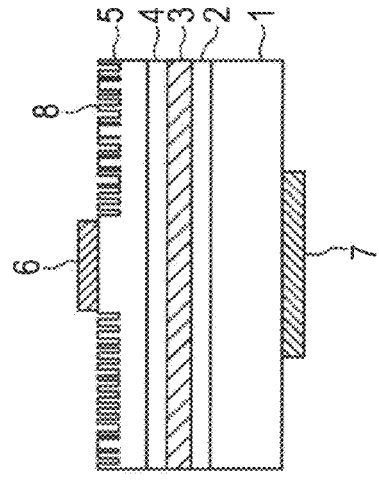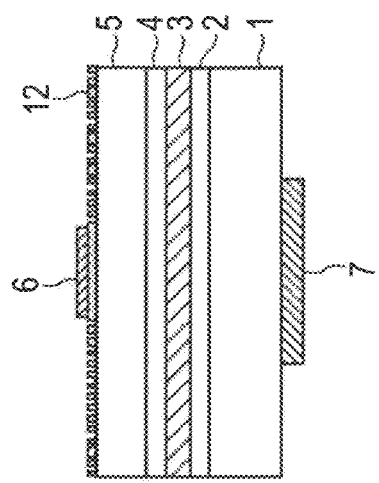

SEMICONDUCTOR LIGHT EMITTING DEVICE

CROSS-REFERENCE TO THE RELATED APPLICATION(S)

The present disclosure relates to the subject matters contained in Japanese Patent Application No. 2008-235513 filed on Sep. 12, 2008, which are incorporated herein by reference in its entirety.

FIELD

The present invention relates to a semiconductor light emitting device having a relief structure exerting a high light extraction characteristic, which is provided on a light extraction surface, and to a method for manufacturing the device.

BACKGROUND

Light emitting diodes (LEDs) are expected to be applied in the fields of illumination and display devices due to the advantages of small-size, low-power-consumption, and long-operating-life. Especially, in recent years, high-brightness and high-efficiency LEDs for car-mounted headlights and domestic lighting are desired. Generally, the total luminous efficiency of an LED is expressed by a product of the internal quantum efficiency and the light extraction efficiency thereof. The internal quantum efficiency is a rate of electron-hole pairs, which generate light of a target wavelength, to that of generated electron-hole pairs and is affected by the crystalline quality of a material and the presence or absence of defects. On the other hand, the light extraction efficiency is the rate of externally extracted light energy to generated light energy and is affected by the loss of light energy caused at the interface between the LED and air. Generally, the light extraction efficiency is poor, as compared with the internal quantum efficiency. Thus, in the development of high-brightness LEDs, mainly the enhancement of the internal light extraction efficiency is performed.

A hitherto proposed method for enhancing the light extraction efficiency has successfully achieved the enhancement of the light extraction efficiency by forming a nano-scaled relief structure on a surface of an LED to prevent the reflection of light at the interface between the LED and air utilizing scattering/diffraction effects. It is required to form such a relief structure as to have a size shorter than the light emission wavelength of the LED. Typical methods of forming such a relief structure are an electron beam lithography method, a nano-imprinting method, and a processing method utilizing the self-assembly of a material. Especially, the processing method utilizing the self-assembly of a material has advantages in that an LED is enabled to have a large area, and that no large equipment is necessary to form the relief structure, and that the cost for forming such a relief structure is low. Thus, the processing method of forming a relief structure utilizing the self-assembly of a material attracts attention as a useful method for enhancing the brightness of an LED.

The processing method utilizing self-assembly can realize a nano-scaled relief structure by utilizing a dot pattern formed in a microphase-separated structure of a block copolymer or a dot pattern of self-aligned nanoparticles as an etched mask. An example of utilization of the microphase-separated structure of the block copolymer is disclosed in JP-B2-4077312. An example of utilization of the self-aligned nanoparticles is disclosed in JP-A-2006-261659. However, in the case of using a block copolymer, usually, dot patterns, whose inter-dot distances are equal to or less than 100 nanometers (nm), can easily be formed to be highly separated. On the other hand, in the case of forming dot patterns whose inter-dot distances are more than 100 nm and are equal to or less than the wavelength of used light, it is necessary to use high-molecular-weight block copolymers and to perform a heat treatment for a sufficient time. Thus, the processing method utilizing self-assembly has a problem in that in a case where a finite heat treatment time is insufficient, a dot pattern, in which dots are connected to each other, is formed due to insufficient phase separation.

As is understood from the foregoing description, the method for enhancing the light extraction efficiency of an LED using a nano-scaled relief structure formed by utilizing the self-assembly of block copolymers has the following problems. That is, it is difficult to form a dot pattern, in which dots are completely separated (or isolated) from one another, on the entire light extraction surface. Thus, the light extraction efficiency is lowered due to the connection among convex portions.

SUMMARY

According to an aspect of the invention, there is provided a semiconductor light emitting device including: a substrate; an electrode layer; and a semiconductor multilayer film disposed between the substrate and the electrode layer, the semiconductor multilayer film including: an n-type semiconductor layer; a p-type semiconductor layer; and an active layer disposed between the n-type semiconductor layer and the p-type semiconductor layer, wherein the semiconductor multilayer film has a light extraction surface from which a light emitted in the semiconductor multilayer film is extracted, the light extraction surface being formed with a relief structure having nano-scaled convex portions, wherein the relief structure is formed to have variation in equivalent circular diameters of the convex portions, and wherein 90% or more of the convex portions in the relief structure are configured to have circularity coefficient of ($4\pi \times$(area)/(circumferential length)$^2$) being equal to or larger than 0.7.

According to another aspect of the invention, there is provided a method for manufacturing a semiconductor light emitting device comprising: a substrate; an electrode layer; and a semiconductor multilayer film disposed between the substrate and the electrode layer, the semiconductor multilayer film comprising: an n-type semiconductor layer; a p-type semiconductor layer; and an active layer disposed between the n-type semiconductor layer and the p-type semiconductor layer, the method including: forming the n-type semiconductor layer, the p-type semiconductor layer, and the active layer on the substrate to form the semiconductor multilayer film; forming the electrode layer on the semiconductor multilayer film; forming a resin composition thin film containing a block copolymer on either the semiconductor multilayer film or an inorganic composition thin film used as an intermediate mask layer; causing the resin composition thin film to phase-separate by performing a heat treatment; and forming the relief structure on a surface of the semiconductor multilayer thin film by etching the semiconductor multilayer thin film using the phase-separated resin composition as a mask.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

FIGS. 2A and 2B are a cross-sectional view and a top view illustrating a semiconductor light emitting device according to the embodiment of the invention, respectively.

FIGS. 4A to 4E are cross-sectional views illustrating a semiconductor light emitting device according to a second embodiment of the invention.

FIGS. 5A to 5E are cross-sectional views illustrating a method of manufacturing a semiconductor light emitting device according to a third embodiment of the invention.

DETAILED DESCRIPTION OF THE EMBODIMENTS

Figure 1:
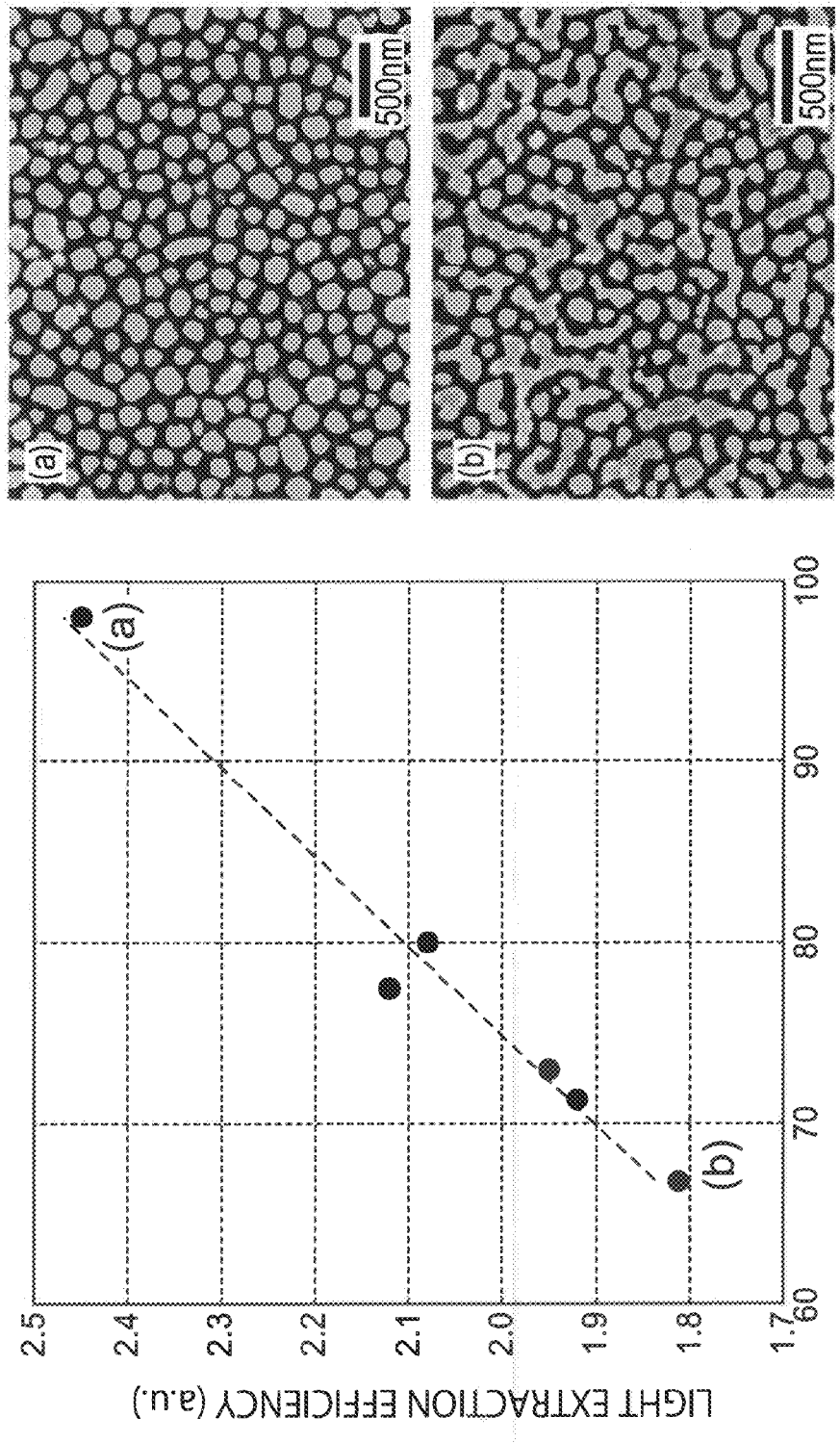
FIG. 1 is a graph illustrating the relationship between the degree of isolation and the light extraction efficiency, which are obtained in an embodiment of the invention, and photographs (a) and (b).
Figure 3A:
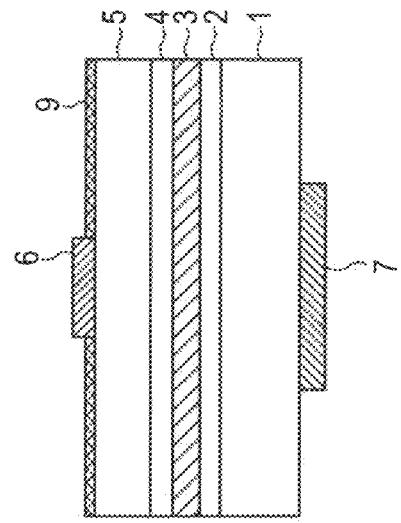
FIGS. 3A to 3D are cross-sectional views illustrating an example of a method of manufacturing a semiconductor light emitting device according to an embodiment of the invention.
Figure 3B:
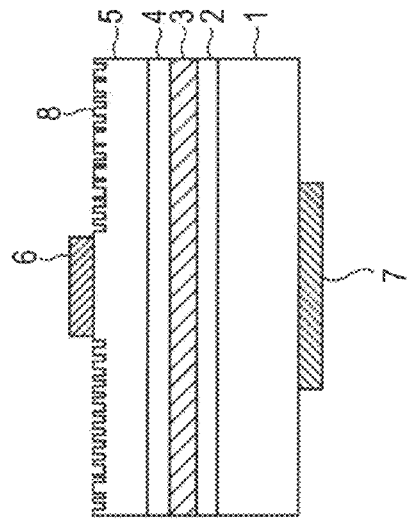
Figure 3C:
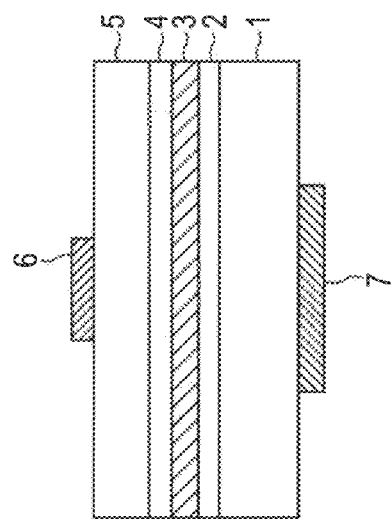
Figure 3D:
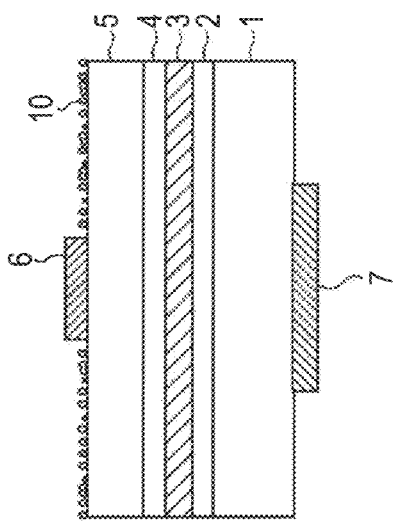

Hereinafter, an embodiment of the invention will be described with reference to the drawings. In the following description, the same or similar components will be denoted by the same reference numerals, and the duplicate description thereof will be omitted.

First, a basic concept of the invention is explained below.

According to the invention, a circularity coefficient C ($=4\pi\times$(area)/(circumferential length)$^2$) is used for evaluating an isolation degree of convex portions of a nano-scaled relief structure formed on a light extraction surface of a semiconductor light emitting device. In a case where the convex portions are perfect circles, the value of the circularity coefficient C is 1 (C=1). As each of the convex portions become closer to an ellipsoid, the value of the circularity coefficient C decreases.

Hereinafter, a method of determining using the circularity coefficient C whether convex portions are isolated from or connected to one another is discussed. In a case where the isolation among the convex portions is low, i.e., in a case where the convex portions are connected to one another, the circularity coefficient C is expected to be close to 0. On the other hand, in a case where the isolation among the convex portions is high, the circularity coefficient C is expected to be close to 1. In a case where two convex portions of different sizes are connected to each other, as the difference in size therebetween is increased, the shape of the combined convex portions is closer to a perfect circle. Thus, the circularity coefficient C has a high value (<1). Further, in a case where a plurality of convex portions of the same size are connected to one another, as the number of the connected convex portions is increased, the value of the circularity coefficient C decreases (C<0.5). In view of the aforementioned circumstances, when the convex portions are connected to each other, it is found that the highest circularity coefficient $C_{max}$ occurs in a case where two convex portions of different sizes are connected to each other. Thus, in a case where $C>C_{max}$, it can be considered that the convex portions are not connected to each other.

In consideration of dot patterns formed by self-assembly of block copolymers, the value of the equivalent circular diameter of dot portions is not constant and is variously changed. Accordingly, the relief structure being formed by utilizing the self-assembly of block copolymers is formed to have variation in equivalent circular diameters of the convex portions. The values of the equivalent circular diameter of the dot portion have a normal distribution. Thus, the circularity coefficient C has a highest value in a case where a dot portion having a minimum equivalent circular diameter is connected to another dot portion having a maximum equivalent circular diameter. In a case where the ratio of the maximum equivalent circular diameter of the formed dot portion to the minimum equivalent circular diameter thereof is m, it is found that $C_{max}=(1+m^2)/(1+m)^2$.

The inventors of the invention have studied zealously to find that the ratio of the maximum equivalent circular diameter of dot portions in each block copolymer formed under practical heat treatment conditions (incidentally, a heat treatment temperature <260° C., a heat treatment time <12 hours) to the minimum equivalent circular diameter thereof was about 5 (m=5). That is, convex portions of a nano-scaled relief structure formed using the self-assembly of a block copolymer were brought into a separated state in a case where the circularity coefficient C>0.7. In addition, based on this idea, it was also found that macroscopic isolation of the convex portions of this relief structure formed on a surface of an LED is given by the following expression (1). Hereunder, the isolation I defined by the expression (1), which represents the macroscopic isolation of the convex portions of the relief structure is referred to as a "isolation degree".

$$I = \frac{\text{the number of isolated convex portions}}{\text{total number of convex portions}} \quad (1)$$

$$\approx \frac{\text{the number of convex portions satisfying } C > 0.7}{\text{total number of convex portions}}$$

Referring to FIG. 1, there is illustrated the relationship between the isolation degree of the nano-scaled relief structure formed on a surface of an LED utilizing the phase-separation of a block copolymer and the light extraction efficiency of the LED. The nano-scaled relief structure is formed on a p-GaP layer, which is a current spreading layer. The light extraction efficiency of the LED is estimated by photoluminescence (PL) measurement and is expressed in terms of relative light extraction efficiency by setting the light extraction efficiency of the LED, whose surface is an unprocessed surface on which no nano-scaled relief structure is formed, to be 1. The average height of the convex portions is 360 nm (the standard deviation of the height is 12 nm). The area ratio (i.e., an occupancy rate) of the area of the convex portions to the area of the entire surface of the LED is about 50%. The convex portions of the relief structure of each sample have substantially the same shape in states other than an isolated state. In FIG. 1, a photograph (a) illustrates a photographed image of an upper part of a relief structure formed at the isolation degree of 98%. In FIG. 1, a photograph (b) illustrates a photographed image of the upper part of the relief structure formed at the isolation degree of 66%. As is seen from photographs (a) and (b) of FIG. 1, the isolation degree of the formed convex portion greatly affects the light extraction efficiency and has substantially linear relationship therewith. Consequently, the invention can implement a semiconductor light emitting device whose light extraction efficiency is equal to or more than 90% that obtained in a completely isolated state in which the convex portions of a relief structure are completely isolated from one another in a case where a relief structure is formed so that the ratio of the number of the convex portions having a circularity coefficient of 0.7 or higher to a total number of the convex portions included in the relief structure is 90% or more, or so that the ratio of the number of the convex portions, which are not connected to and are isolated from an adjacent convex portion, to a total number of the convex portions included in the relief structure is 90% or more.

According to the invention, an outermost layer in a light emitting direction of a semiconductor multilayer film is used as a surface, on which microscopic concave and convex portions are formed, for the following reasons. That is, generally, among bonding interfaces of a plurality of materials constituting an optical transmission path, on an interface on which the refractive index largely changes (e.g., the refractive index changes 1.5 or more thereon), optical transmission loss is large. Thus, in order to efficiently extract light, which is emitted from a light emitting device, to the outside, microscopic concave and convex portions on a surface constituting such an interface. Examples of such an interface are an interface between a semiconductor multilayer, which constitutes a light emitting device, and an air layer, or an interface between a semiconductor multilayer and a protection film in a case where a plastic protection film or the like is formed for protecting a light emitting device.

The relief structure according to the invention has advantages in that light extraction efficiency is increased by extracting light, which is emitted from an active layer and is usually taken only from the inside of the critical angle to the outside (i.e., an air or resin), as high-order diffraction light taken from the outside of a critical angle due to diffraction effects. In the case of this relief structure, the distance between adjacent convex portions corresponds to the interval of diffraction gratings. Thus, the following expression (2) can be applied to a light emitting wavelength.

$$n_0 \times \sin \theta_m - n_s \times \sin \theta_i = m \times \lambda/d \qquad (2)$$

In the expression (2), $\theta_m$ denotes an angle of output to an external portion, $\theta_i$ denotes an angle of incidence at the side of the semiconductor light emitting device, $\lambda$ denotes a light emitting wavelength, d denotes the distance between adjacent convex portions, m denotes an integer representing a diffraction order (m=0, ±1, ±2, . . . ), $n_s$ denotes the refractive index of a semiconductor layer that is the uppermost layer of the semiconductor multilayer film, and $n_0$ denotes an external refractive index. As is understood from the expression (1), in a case where the convex portions are connected to each other due to insufficient phase separation caused by the self-assembly thereby to form new convex portions, the distances d from each convex portion to adjacent surrounding convex portions are increased so that diffraction conditions are not satisfied, and that light extraction due to the diffraction effects cannot be expected. Further, in a case where the convex portions are connected to each other to be one-dimensionally extended, light extraction characteristics affects output light deflected in a certain direction, so that the extracted light has an anisotropic property, and that an amount of extracted light is reduced. A relief structure according to the invention can suppress reduction in the diffraction effects due to the connection of the convex portions, and can achieve high light extraction efficiency.

Hereinafter, an embodiment according to the invention is described in detail.

A semiconductor light emitting device according to the invention may be a light emitting diode (LED) or a laser diode (LD).

FIGS. 2A and 2B illustrate an embodiment of the semiconductor light emitting device according to the invention. FIG. 2A is a cross-sectional view illustrating an example of a configuration of the semiconductor light emitting device according to the invention. FIG. 2B is a plan view illustrating an upper part of the semiconductor light emitting device according to the invention. As illustrated in FIG. 2A, an n-type semiconductor layer (clad layer), an active layer 3, a p-type semiconductor layer (clad layer) 4, and a current spreading layer 5 are formed on a crystal substrate 1 sequentially. Thus, a semiconductor multilayer is formed. A p-side electrode 6 is attached onto the current spreading layer 5. An n-side electrode 7 is attached to the bottom of the crystal substrate 1. Ohmic contacts are formed on the current spreading layer 5 and the crystal substrate 1, respectively. The aforementioned basic components are substantially the same as those of the conventional element. However, microscopic relief structure 8 is formed on an exposed surface of the current spreading layer 5, on which no electrodes are formed. Microscopic relief structure 8 is not formed under the p-side electrode 6, because a contact resistance would be increased if microscopic relief structure 8 is formed under the p-side electrode 6.

Incidentally, the current spreading layer 5 is provided to expand the current distribution in the element and to expand the light emitting region of the active layer. Further, the light extraction surface is an outermost surface of the element, from which light is emitted to the outside, and is a surface of the semiconductor multilayer, which is opposite to the surface thereof to be contacted with the substrate. In FIG. 2A, the light extraction surface corresponds to the top surface of the current spreading layer 5. Furthermore, the expression "a light extraction side" denotes a side in the direction of the light extraction surface with respect to the active layer.

As illustrated in FIG. 2B, the microscopic relief structure 8 is formed around the p-side electrode 6 that is formed on the current spreading layer 5. There is a part, in which the convex and concave portions 8 are connected to one another, on the current spreading layer 5.

Examples of semiconductors constituting the semiconductor multilayer are GaP, InGaAlP, AlGaAs, GaAsP, and nitride semiconductors. A method for manufacturing such materials is, e.g., a metal organic chemical vapor deposition (MOCVD) method, a molecular beam epitaxy (MBE) method, a vapor phase epitaxy (VPE) method, and a liquid phase epitaxy (LPE) method. The materials of the crystal substrate are, e.g., gallium arsenide, sapphire, silicon, silicon nitride, silicon carbide, and zinc oxide. The structure of a semiconductor light emitting device is not limited to a structure in which an upper electrode corresponds to a p-side, and in which a lower electrode corresponds to an n-side. The invention can be applied to a structure in which an upper electrode corresponds to an n-side, and in which a lower electrode corresponds to a p-side. A buffer layer is formed between the crystal substrate and the semiconductor multilayer, if necessary. A current spreading layer and a contact layer can be formed between the electrode layer and the semiconductor multilayer. The structure of the active layer is not limited to a simple pn-junction structure. One of known structures, e.g., a double hetero (DH) structure, a single quantum well (SQW) structure, or a multiple quantum well (MQW) structure can be used as the structure of the active layer. Preferably, the material of the electrode layer of the semiconductor light emitting device according to the invention can make Ohmic contact with a semiconductor. More specifically, the electrode layer is a single layer or multilayer made of a metal or alloy selected at least one of Au, Ag, Al, Zn, Ge, Pt, Rd, Ni, Pd, and Zr.

A nano-processing method utilizing the self-assembly of the material is useful for manufacturing a semiconductor light emitting device having a relief structure of a pattern whose resolution exceeds the limit resolution of general photolithography technology, which is needed by the device according to the invention.

Hereinafter, a manufacturing method utilizing the microphase separation of a block copolymer is described in detail with reference to FIGS. 3A to 3D.

First, a DH structure portion, in which the active layer 3 is sandwiched between the clad layers 2 and 4, is formed on the substrate 1. Then, the current spreading layer 5 is formed thereon. Further, the p-side electrode 6 is formed on the current spreading layer 5. The n-side electrode 7 is formed on the back surface of the substrate 1 (see FIG. 3A).

Next, a solution, in which a resin composition containing a block copolymer is dissolved using an organic solvent, is applied thereon by a spin-coating method. Then, a heat treatment is performed on the material placed on a hot plate until the organic solvent is vaporized. Thus, the resin composition film 9 containing a block copolymer is formed on the current spreading layer 5 (see FIG. 3B).

Subsequently, the microphase-separation of the block copolymer is caused by performing a heat treatment at a temperature, which is higher than a glass transition temperature of a polymer seed constituting the block copolymer, in an oven in a nitrogen atmosphere. At that time, an obtained phase-separation pattern is a dot pattern. A polymer seed constituting the dot portion is superior in the etching resistance to a polymer seed constituting a matrix portion. Thus, only the matrix portion can be eliminated by performing reactive ion etching (RIE) using an appropriate etching gas so that the dot portion 10 is left (see FIG. 3C).

Further, at that time, etching is continued (i.e., what is called "over-etching" is performed) upon completion of the elimination of the matrix portion. Thus, the shape of the dot portion 10 is shrunk to separate the connected dot portions from one another. Consequently, a dot pattern with high separation can be obtained.

Subsequently, etching is performed on the current spreading layer 5 serving as a base layer by employing this polymer-dot-portion 10 as a mask and performing RIE, which uses $Cl_2$-based gas. Finally, the residual polymer-dot-portion 10 is removed by performing ashing, which uses an oxygen gas. Thus, a cylindrical relief structure 8 is formed on a surface of the current spreading layer 5. Accordingly, the manufacture of a semiconductor light emitting device according to the invention is implemented.

The order of performing steps of the proposed method of manufacturing the semiconductor light emitting device is not limited to the aforementioned order of the steps. For example, the semiconductor light emitting device may be manufactured by forming the relief structure 8 on the current spreading layer 5 before the p-side electrode layer 6 is formed, and then forming the p-side electrode layer 6. Thus, the semiconductor light emitting device can be manufactured by a method obtained by the combination of the aforementioned steps.

Further, the semiconductor light emitting device may be manufactured by utilizing a pattern transfer method. An example of such pattern transfer method is described in JP-A-2001-151834 (counterpart U.S. publication is: U.S. Pat. No. 6,565,763 B1). Because the etching selectivity between a normal polymer and a compound semiconductor is low, it is difficult to form a relief structure with a high aspect ratio. A resin composition containing a block copolymer is formed after an inorganic composition thin film is formed on the current spreading layer as a hard mask. Then, the microphase-separation is caused. Subsequently, a dot pattern of the block copolymer is transferred onto the inorganic composition thin film by performing RIE or a wet etching process. According to this method (i.e., a pattern transfer method), a relief structure having a high aspect ratio can be produced on the current spreading layer by forming an inorganic composition mask, whose etching resistance is higher than that of the polymer seed constituting the block copolymer. Preferably, the inorganic composition has etching resistance, which is higher than that of the polymer seed constituting the block copolymer, against RIE using $O_2$, Ar, and $Cl_2$ gases. The material of the inorganic composition is, e.g., silicon, silicon nitride, oxide silicon, or the like, the film of which is formed by a sputtering method, a vacuum evaporation method, or a chemical vapor deposition method. Additionally, spin-coated siloxane-polymer, polysilane, spin-on glass (SOG), and the like are effective materials.

The semiconductor light emitting device may be manufactured by sharpening is performed on the convex portions by performing sputtering on the formed cylindrical relief structure using an argon gas. Thus, a circular conic structure, a cylindrical structure, or a mesa structure is formed. Consequently, a relief structure, to which a refractive index gradient effect is imparted, can be formed. An example of such method is described in JP-A-2006-108635.

In manufacturing the semiconductor light emitting device having the relief structure, a dotted pattern is optimum as the morphology of the block copolymer.

Preferably, the equivalent circular diameter of each convex portion of the relief structure having the light extraction characteristic according to the invention has a dimension which does not cause Rayleigh scattering against the light emitting wavelength of the semiconductor light emitting device, i.e., a dimension which is equal to or longer than 1/10 the light emitting wavelength. Considering the light emitting wavelength in a range from an ultraviolet part to an infrared part (i.e., a range between 300 nm to 900 nm), the equivalent circular diameter of each convex portion should be in a range from 30 nm to 90 nm or more. Therefore, it is desirable that the molecular weight of the block copolymer used according to the invention is equal to or more than 500,000 and is equal to or less than 3,000,000. In a case where the block copolymer has a high molecular weight of 3,000,000 or more, such a block copolymer is impractical, because of the facts that when the block copolymer is dissolved in an organic solvent, the degree of viscosity of a solution is high, so that when spin-coating is performed, problems of coating, e.g., coating irregularities, occur.

When block copolymers, whose molecular weight are 500,000 to 3,000,000, are used, such a high molecular weight block copolymer requires a long heat treatment for causing microphase-separation. Thus, in the case of a finite heat treatment time, insufficient phase separation causes a problem that dots are brought into a connected state. This profoundly affects the isolation state of the convex portions of the relief structure finally formed on the semiconductor light emitting device. Thus, the obtained light extraction efficiency is degraded. The inventors of the present invention have devised a technique of adding at least one low molecular weight homopolymer selected from a plurality of monomers constituting the block copolymer to the resin composition containing the block copolymer as effective means for solving the problem due to the insufficient phase separation of the block copolymer (see JP-B2-4077312).

Further, the inventors of the present invention conducted various studies in order to implement a phase-separated state with high separation. As a result, the inventors have found the following facts. (1) At least one of homopolymers to be added was such that a number average molecular weight ($M_n$) is equal or less than 3,000, and that a molecular weight distribution (i.e., the ratio of a weight average molecular weight ($M_w$) to the number average molecular weight ($M_n$) : $M_w/M_n$) was equal to or less than 1.2, and (2) one or more low molecular weight homopolymers, which were 30 wt % or more of the resin composition containing the block copolymer, were added to this resin composition to thereby obtain a microphase-separated pattern in a highly separated state (the isolation degree was equal to or higher than 90%) for a time which is dramatically shorter than a conventional heat treatment time taken to perform the heat treatment of the block copolymer.

Preferably, the solvent for dissolving the resin composition containing the block copolymer at the formation of the resin composition thin film is a good solvent for two types of polymers constituting the block copolymer. Generally, the repulsive force acting between two polymer chains is proportional to the square of the difference in solubility parameter between the two types of polymer chains. Thus, when a good solvent for the two types of polymers is used, the difference in solubility parameter between the two types of polymer chains is decreased. Free energy of the system is reduced. Such a condition is advantageous to the phase separation. Preferably, solvents having high boiling points, which are equal to or higher than, e.g., 150° C., e.g., ethylcellosolve-acetate (ECA), propylene-glycol-monomethyl-ether-acetate (PG-MEA), and ethyl-lactate (EL) are used as the solvents for dissolving the block copolymer and the homopolymer to prepare a uniform solution.

Further, the inventors of the present invention conducted various experiments concerning the relationship between the thickness of the resin composition thin film containing the block copolymer and the generated phase-separated pattern. As a result, it has experimentally been found that the thinner the resin composition thin film was made, the higher the isolation of the convex portions of the generated dot pattern was. A high isolation degree was obtained when the average film thickness was equal to or less than 150 nm corresponding to the equivalent circular diameter (whose value was in a range from 30 nm to 90 nm or more) of the convex portion of the semiconductor light emitting device.

Preferably, the block copolymers according to the invention are a combination of an aromatic ring polymer and an acrylic polymer. The reason is that generally, two types of polymers differ in etching speed corresponding to RIE processing using an appropriate gas seed. Patent Document 1 discloses this principle. Examples of such an aromatic ring polymer are polystyrene (PS), polyvinyl-naphthalene, polyhydroxy-styrene, and derivatives thereof. Examples of such an acrylic polymer are alkylmethacrylate, such as polymethylmethacrylate (PMMA), polybutylmethacrylate, and polyhexylmethacrylate, and polyphenylmethacrylate, and polycyclohexylmethacrylate, and derivatives thereof. Similar properties can be obtained by using acrylate instead of methacrylate. Among these substances, block copolymers of PS and PMMA are preferable, because of the facts that the combination of PS and PMMA is easy and that the molecular weight of each of these polymers is easily controlled.

FIRST EXAMPLE

A semiconductor light emitting device having an InGaAlP DH structure in the active layer was manufactured as a first example. A schematic view of the semiconductor light emitting device according to the first example corresponds to FIGS. 2A and 2B.

An Si-doped n-type (100) face GaAs substrate was used as the crystal substrate. Furthermore, Si-doped n-$In_{0.5}$ $(Ga_{0.3}Al_{0.7})_{0.5}P$ layer (thickness: 1 μm) was formed as a n-type semiconductor layer by the MOCVD method using trimethyl-indium (TMI), trimethyl-gallium (TMG), trimethyl-aluminum (TMA), $PH_3$ and $SiH_4$ as materials. Next, $In_{0.5}(Ga_{0.8}Al_{0.2})_{0.5}P$ layer having a thickness of 0.6 μm was grown as the active layer using TMI, TMG, TMA, and $PH_3$ as materials. Further, Zn-doped p-$In_{0.5}(Ga_{0.3}Al_{0.7})_{0.5}P$ layer (thickness: 1 μm) was grown as a p-type semiconductor layer using TMI, TMG, TMA, $PH_3$, and dimethyl-zinc (DMZ) as materials. In addition, Zn-doped p-GaP (thickness: 5 μm) was grown as the current spreading layer using TMG, $PH_3$, and DMZ as materials.

Next, Au thin film (thickness: 50 nm) was deposited on the entire bottom surface of the n-type GaAs substrate by the vacuum evaporation method. Subsequently, AuGe alloy thin film (thickness: 200 nm) was deposited thereon as the n-side electrode layer. Further, Au thin film (thickness: 50 nm) and AuZn alloy thin film (thickness: 200 nm) were serially formed on the current spreading layer as the p-side electrode layer by the vacuum evaporation method. Subsequently, each of the n-side electrode layer and the p-side electrode layer was processed into a predetermined shape. Then, a heat treatment was performed at 400° C. for 20 minutes in a nitrogen atmosphere. Thus, Ohmic contact were formed on the n-side electrode layer/n-type GaAs substrate interface, and p-GaP/p-side electrode layer interface.

Hereinafter, the step of forming the relief structure on the current spreading layer positioned at the light extraction side is described in detail.

First, a solution obtained by diluting PS-PMMA block copolymer ($M_n$=895.000, $M_w/M_n$=1.08) was diluted using PGMEA to 4.0 wt %, and a solution obtained by diluting PMMA homopolymer ($M_n$=1.720, $M_w/M_n$=1.15) using PGMEA to 4.0 wt % and a solution obtained by diluting PS homopolymer ($M_n$=1.790, $M_w/M_n$=1.06) using PGMEA to 4.0 wt % were weighed so that the ratio by weight among the polymers (PS-PMMA), (PMMA), and (PS) was 4:6:1. Subsequently, filtering was performed thereon using a filter with a 0.2 μm. Thus, a resin composition solution containing a block copolymer was prepared.

Then, this solution was spin-coated on the current spreading layer p-GaP (the number of rotation is 3000 rpm). Subsequently, the resin composition was heated on a hot plate at 110° C. for 90 seconds. Thereafter, the resin composition was put into an oven. Then, a heat treatment was performed thereon in a nitrogen atmosphere on conditions that a temperature was 250° C. and that a heat treatment time was 8 hours. The morphology of the obtained phase-separated pattern was such that the average equivalent circular diameter of a dotted PS micro-domain in the PMMA matrix was about 80 nm, and that the average inter-dot distance was 140 nm. PS dots were highly separated (the circularity coefficient was equal to or more than 0.7). The ratio of the number of the completely separated dots to a total number of dots was 98% (the isolation degree was 98%). Further, upon completion of the heat treatment, the thickness of the block copolymer layer was 100 nm.

Next, the PMMA matrix portion of the block copolymer was selectively deleted by performing $O_2$ plasma RIE ($O_2$=30 standard cubic centimeters per minute (sccm), Pressure=100 mTorr, Bias Power=100 W). Thus, a mask having PS dots was obtained. The PMMA was etched by the $O_2$ plasma RIE at an etching speed that is three times that at which PS was etched. Consequently, only PS phase can be left by completely removing PMMA phase.

Then, etching was performed by an induction coupled plasma (ICP)-RIE apparatus using the PS dot mask formed on the p-GaP layer. Etching conditions were as follows, $Cl_2$=5 sccm, Ar=15 sccm, Pressure=5 mTorr, Power=100 W, ICP power=30 W. After this etching, the remaining PS mask was removed by performing oxygen ashing for 1 minute. Thus, a relief structure was obtained on the p-GAP layer. The average height of the convex portion formed in the manufactured semiconductor light emitting device was 200 nm. The average distance between the adjacent convex portions was 140 nm. The area ratio (occupancy rate) of the convex portions to the entire light extraction surface was 48%. The isolation degree was 98%, similarly to that in the case of the phase-separated pattern resin component containing the block copolymer.

Advantages of the semiconductor light emitting device manufactured according to the first example were evaluated. Thus, the following two semiconductor light emitting devices were prepared as comparative examples. One was a semiconductor light emitting device having a configuration similar to that of the first example except that a surface treatment was not performed on the semiconductor light emitting device. The other was a semiconductor light emitting device also having a configuration similar to that of first example except that the isolation degree of the convex portion of the pattern was 66%.

The semiconductor light emitting device having the relief structure having the isolation degree of 66% was manufactured by a manufacturing method similar to the manufacturing method for first example, except that a solution prepared by diluting PS-PMMA block copolymer used in first example using PGMEA to 3.5 wt % and a solution prepared by diluting PMMA homopolymer ($M_n$=3000, $M_w/M_n$=1.5) using PGMEA to 3.5 wt % was mixed at the following ratio by weight: (PS-PMMA): (PMMA)=7:3, and subsequently spin-coating the mixed solution at the number of rotations (=2000 rpm) to form a resin composition thin film containing a block copolymer.

Outputs of all the semiconductors according to first example and two comparative examples were measured by a chip tester. In a case where the output of the device of comparative example having the surface, on which no surface treatment was performed, was set at 1, the output of the device of comparative example having the relief structure, whose isolation degree was 66%, was 1.22, and the output of the device of first example was 1.44 (see Table 1).

TABLE 1

| Extraction Surface | Isolation Degree (%) | Occupancy Rate (%) | Average height of Convex Portion (nm) | Average Distance between Adjacent Convex Portions (nm) | Extraction Efficiency (a.u.) |
|---|---|---|---|---|---|
| 1 Flat | — | — | — | — | 1 |
| 2 Relief Structure | 66 | 48 | 200 | 140 | 1.22 |
| 3 Relief Structure | 98 | 48 | 200 | 140 | 1.44 |

*) The light extraction surface was formed on a current spreading layer formed of a p-GaP layer whose light emitting wavelength was 635 nm.

SECOND EXAMPLE

Next, a semiconductor light emitting device having an InGaAlP DH structure in an active layer, similarly to first example, and having an n-type semiconductor layer located at the light extraction side was manufactured as a second example. FIGS. 4A to 4E illustrate the semiconductor light emitting device manufactured according to the second example.

On a p-GaAs substrate, according to an MOCVD method, Zn-doped p-$In_{0.5}(Ga_{0.3}Al_{0.7})_{0.5}P$ layer (thickness: 1 µm) was formed as a p-type semiconductor layer. Next, $In_{0.5}(Ga_{0.8}Al_{0.2})_{0.5}P$ layer having a thickness of 0.6 µm was grown as an active layer. Further, an Si-doped n-$In_{0.5}(Ga_{0.3}Al_{0.7})_{0.5}P$ layer (thickness: 1 µm) was grown as an n-type semiconductor layer. Then, n-GaP (5 µm) was grown as the current spreading layer.

Next, Au thin film (thickness 50 nm) was deposited on the entire lower surface of p-GaAs substrate by vacuum evaporation method. Subsequently, AuZn alloy thin film (thickness 200 nm) was deposited thereon as a p-side electrode layer. Further, on the current spreading layer, Au thin film (thickness 50 nm) and AuGe alloy thin film (thickness 200 nm) were serially deposited as an n-side electrode layer. Subsequently, the n-side electrode layer and the p-side electrode layer are processed into desired shapes. Next, a heat treatment was performed at 400° C. in a nitride atmosphere for 20 minutes. Thus, Ohmic contacts were formed on an interface between an n-side electrode layer and n-Gap layer and an interface between a p-GaAs and a p-side electrode layer, respectively.

A relief structure was formed on n-GaP current spreading layer by a method similar to the method used in the case of first example. The relief structure finally formed on the n-GaP layer was such that the average height thereof was 200 nm, the average distance between adjacent convex portions was 140 nm, and the occupancy rate was 49%, and that the isolation degree of the convex portion was 98%.

Two semiconductor light emitting devices were prepared as comparative examples. One was a semiconductor light emitting device having a configuration similar to that of second example except that a surface treatment was not performed on a surface of this semiconductor light emitting device. The other was a semiconductor light emitting device also having a configuration similar to that of second example except that the isolation degree of the convex portion of the pattern was 65%. The light emitting device having the pattern whose convex portion having the isolation degree of 65% was manufactured by a manufacturing method similar to the manufacturing method for comparative example corresponding to first example.

Outputs of all of the light emitting device according to second example and comparative examples were measured by a chip tester. In a case where the output of the device of comparative example having the surface, on which no surface treatment was performed, was set at 1, the output of the device of comparative example having the relief structure, whose isolation degree was 65%, was 1.18, and the output of the device of first example was 1.41 (see Table 2).

TABLE 2

| Extraction Surface | Isolation Degree (%) | Occupancy Rate (%) | Average height of Convex Portion (nm) | Average Distance between Adjacent Convex Portions (nm) | Extraction Efficiency (a.u.) |
|---|---|---|---|---|---|
| 1 Flat | — | — | — | — | 1.00 |
| 2 Relief Structure | 65 | 49 | 200 | 140 | 1.18 |
| 3 Relief Structure | 98 | 49 | 200 | 140 | 1.41 |

*) The light extraction surface was formed on a current spreading layer formed of a n-GaP layer whose light emitting wavelength was 635 nm.

THIRD EXAMPLE

As a third example, a light emitting device having a relief structure with a high aspect ratio was manufactured by forming SOG mask by transferring a microphase-separated pattern of the resin composition containing a block copolymer onto SOG film according to a pattern transfer method.

According to the third example, a semiconductor light emitting device having a structure similar to the structure employed in first example was manufactured (FIG. 5A). Then, 6.0 wt % SOG solution diluted using ethyl lactate was spin-coated on the formed p-GaP (the number of rotations=1800 rpm) for 30 seconds. Subsequently, ethyl lactate was evaporated by performing a heat treatment thereon on a hot plate at 110° C. for 90 seconds. Then, baking was performed in a nitrogen atmosphere 30 minutes at 300° C. Thus, SOG film having a thickness of 100 nm was formed on p-GaP layer. Next, similarly to first example, a resin composition thin film containing a block copolymer was formed on SOG film. Baking was performed thereon on a hot plate. Further, a heat treatment for micro phase-separation was performed in a nitrogen atmosphere (see FIG. 5B). Then, PMMA phase in the resin composition containing the microphase-separated block copolymer was removed by performing RIE processing similar to that performed in first example (see FIG. 5C). Next, the PS dot mask pattern was transferred onto the SOG film of the base layer by performing RIE ($CF_4$=15 sccm, $CHF_3$=15 sccm, Pressure=10 mTorr, Power=100 W) using $F_2$-based gas. Thus, SOG mask was formed (see FIG. 5D). The residual PS mask was eliminated by oxygen ashing. Subsequently, a relief structure was formed on the p-GaP layer of the base layer using the SOG mask on ICP-RIE conditions similar to those in the case of first example (see FIG. 5E). The formed relief structure was similar in shape (the average distance between the adjacent convex portions: 140 nm; the occupancy rate: 48%; the isolation degree: 98%) to those formed in first example except that the average height of the convex portion was 450 nm.

A light emitting device was prepared as a comparative example, which has a configuration similar to that of third example except that a surface treatment was not performed on this semiconductor light emitting device. Another light emitting device was prepared as another comparative example, which also has a configuration similar to that of third example, except that a relief structure (the average distance between the adjacent convex portions was 140 nm, the occupancy rate of the convex portions was 48%, and the isolation degree thereof was 67%) similar to that of the comparative example corresponding to first example except for the average height of the convex portions, which was 450 nm, was formed by the aforementioned pattern transfer method.

Outputs of all of the semiconductor light emitting device according to third example and comparative examples were measured by a chip tester. In a case where the output of the device of comparative example having the surface, on which no surface treatment was performed, was set at 1, the output of the device of comparative example having the relief structure, whose isolation degree was 67%, was 1.31, and the output of the device of third example was 1.65 (see Table 3).

TABLE 3

| Extraction Surface | Isolation Degree (%) | Occupancy Rate (%) | Average height of Convex Portion (nm) | Average Distance between Adjacent Convex Portions (nm) | Extraction Efficiency (a.u.) |
|---|---|---|---|---|---|
| 1 Flat | — | — | — | — | 1.00 |
| 2 Relief Structure | 65 | 48 | 45.0 | 140 | 1.31 |
| 3 Relief Structure | 98 | 48 | 45.0 | 140 | 1.65 |

*) The light extraction surface was formed on a current spreading layer formed of a p-GaP layer whose light emitting wavelength was 635 nm.

FOURTH EXAMPLE

As a fourth example, four types of relief structures, which differ from one another in the average distance between adjacent convex portions, were formed by the pattern transfer method on the current spreading layer of the light emitting device used in first example.

First, a method for preparing a resin solution containing a block copolymer is described below. The used block copolymer was a PS-PMMA block copolymer, whose molecular weight distribution ($M_w/M_n$) was 1.18 ($M_w/M_n$=1.18), including PS polymer whose molecular weight ($M_n$) was 315,000 ($M_n$=315,000), and PMMA polymer whose $M_n$=815,000. A solution was prepared by dissolving each of this PS-PMMA block copolymer, a PMMA homopolymer ($M_n$=1720, $M_w/M_n$=1.08), and a PS homopolymer ($M_n$=3000, $M_w/M_n$=1.42) to 3.5 wt % using PGMEA as a solvent. Then, such solutions, each of which had a predetermined mixed quantity, were blended. Subsequently, an SOG film, whose film thickness was 100 nm, was formed on a current spreading layer of a light emitting device substrate as to have a predetermined film thickness by performing a spin coat method on the blended solution. Then, a resin composition thin film containing the block copolymer was formed on the SOG film. Subsequently, a heat treatment for phase-separation was performed in a nitrogen atmosphere on conditions that a heat treatment temperature was 250° C., and that the heat treatment time was 8 hours. Table 4 shows the composition ratio among the PS-PMMA block copolymer, the PMMA homopolymer, and the PS homopolymer, the contained amount of the homopolymer, the average inter-dot distance of an obtained microphase-separated pattern, and the isolation degree of a relief structure having the microphase-separated pattern. As is seen from Table 4, the average inter-dot distance can be controlled at the isolation degree of 90% or higher by changing the blended amounts of the block copolymer and the homo polymers.

TABLE 4

| Composition Ratio (wt %) PS-PMMA:PMMA:PS | Amount of Homopolymer Contained (wt %) | Film Thickness (nm) | Average Inter-dot Distance (nm) | Degree of Isolation (%) |
|---|---|---|---|---|
| 1 4:6:1 | 64 | 100 | 140 | 95 |
| 2 5:5:1.5 | 57 | 130 | 200 | 95 |
| 3 8:2:1.5 | 30 | 140 | 260 | 95 |
| 4 6:4:2.5 | 52 | 130 | 320 | 95 |

Subsequently, first, an $O_2$-RIE treatment ($O_2$=30 sccm, Pressure=100 mTorr, Power=100 W) was performed on the resin composition thin film containing the block copolymer, similarly to third example. Then, RIE (CF$_4$=15 sccm, CHF$_3$=15 sccm, Pressure=10 mTorr, Power=100 W) using F$_2$-based gas was performed. Thus, an SOG mask was formed. Subsequently, a relief structure was formed on the p-GaP layer of the base layer using the SOG mask under ICP-RIE conditions similar to those in the case of first example. The average height of convex portions formed on each element was 300 nm. The isolation degree of the convex portions was 95%. The occupancy rate thereof was 50%.

Table 5 shows a result of measurement of light output of the semiconductor light emitting device (the light emitting wavelength thereof was 635 nm) manufactured according to the present example. The light extraction efficiency is shown in relative value to be obtained so that the efficiency is 1 in the case of the light output of a semiconductor light emitting device whose surface is untreated.

TABLE 5

| | Extraction Surface | Isolation Degree (%) | Average Distance between Adjacent Convex Portions (nm) | Average height of Convex Portion (nm) | Light Extraction Efficiency (a.u.) |
|---|---|---|---|---|---|
| 1 | Flat | — | — | — | 1.00 |
| 2 | Relief Structure | 95 | 140 | 300 | 1.55 |
| 3 | Relief Structure | 95 | 200 | 300 | 1.63 |
| 4 | Relief Structure | 95 | 260 | 300 | 1.74 |
| 5 | Relief Structure | 95 | 320 | 300 | 1.64 |

*) The light extraction surface was formed on a current spreading layer formed of a p-GaP layer whose light emitting wavelength was 635 nm.

Thus, according to the present example, the average distance between adjacent convex portions can optionally be controlled by controlling the composition ratio, while a high isolation degree is maintained, of the resin composition containing the block copolymer, to which the homopolymer was added. Consequently, the following advantages can be obtained. That is, higher diffraction effects can be obtained by setting the optimal distance between adjacent convex portions with respect to the light emitting wavelength of the semiconductor light emitting device. Further, a relief structure having high light extraction efficiency can be formed.

It is to be understood that the invention is not limited to the specific embodiments described above and that the invention can be embodied with the components modified without departing from the spirit and scope of the invention. The invention can be embodied in various forms according to appropriate combinations of the components disclosed in the embodiments described above. For example, some components may be deleted from the configurations described as the embodiments. Further, the components described in different embodiments may be used appropriately in combination.

What is claimed is:

1. A semiconductor light emitting device comprising:
a substrate;
an electrode layer; and
a semiconductor multilayer film disposed between the substrate and the electrode layer, the semiconductor multilayer film comprising:
an n-type semiconductor layer;
a p-type semiconductor layer; and
an active layer disposed between the n-type semiconductor layer and the p-type semiconductor layer,
wherein the semiconductor multilayer film has a light extraction surface from which a light emitted in the semiconductor multilayer film is extracted, the light extraction surface being formed with a relief structure having nano-scaled convex portions,
wherein the relief structure is formed to have variation in equivalent circular diameters of the convex portions, and
wherein 90% or more of the convex portions in the relief structure are configured to have circularity coefficient of (4π×(area)/(circumferential length)$^2$) being equal to or larger than 0.7.

2. The device of claim 1, wherein 90% or more of the convex portions in the relief structure are configured to have the circularity coefficient being larger than $C_{max}$ defined by $C_{max}=(1+m^2)/(1+m)^2$, where m is a ratio of the maximum equivalent circular diameter of the convex portions to the minimum equivalent circular diameter of the convex portions.

3. The device of claim 1, wherein the semiconductor multilayer film further comprises a current spreading layer disposed beneath the electrode layer, the current spreading layer having the light extraction surface.

4. A semiconductor light emitting device comprising:
a substrate;
an electrode layer; and
a semiconductor multilayer film disposed between the substrate and the electrode layer, the semiconductor multilayer film comprising:
an n-type semiconductor layer;
a p-type semiconductor layer; and
an active layer disposed between the n-type semiconductor layer and the p-type semiconductor layer,
wherein the semiconductor multilayer film has a light extraction surface from which a light emitted in the semiconductor multilayer film is extracted, the light extraction surface being formed with a relief structure having nano-scaled convex portions,
wherein the relief structure is formed to have variation in equivalent circular diameters of the convex portions,
wherein 90% or more of the convex portions in the relief structure are configured to be isolated from adjacent convex portions; and
wherein 90% or more of the convex portions in the relief structure are configured to have circularity coefficient of (4π×(area)/(circumferential length)$^2$) being larger than $C_{max}$ defined by $C_{max}=(1+m^2)/(1+m)^2$, where m is a ratio of the maximum equivalent circular diameter of the convex portions to the minimum equivalent circular diameter of the convex portions.

5. The device of claim 4, wherein the semiconductor multilayer film further comprises a current spreading layer disposed beneath the electrode layer, the current spreading layer having the light extraction surface.

6. The device of claim 1, wherein the convex portions are configured to have at least one of a circular conic structure, a cylindrical structure, or a mesa structure.

7. The device of claim 4, wherein the convex portions are configured to have at least one of a circular conic structure, a cylindrical structure, or a mesa structure.

* * * * *